United States Patent [19]

Glenat

[11] Patent Number: 5,528,143
[45] Date of Patent: Jun. 18, 1996

[54] LOOP OSCILLATOR NMR PROBE

[75] Inventor: Henri Glenat, Corenc, France

[73] Assignee: Commissariat a l'Energie Atomique, Paris, France

[21] Appl. No.: 258,702

[22] Filed: Jun. 13, 1994

[30] Foreign Application Priority Data

Jun. 24, 1993 [FR] France .................. 93 07691

[51] Int. Cl.⁶ .................................................. G01V 3/00
[52] U.S. Cl. .................. 324/303; 324/300; 324/301; 324/302
[58] Field of Search .................. 324/300, 301, 324/302, 303, 304, 318, 322

[56] References Cited

U.S. PATENT DOCUMENTS

| 5,051,700 | 9/1991 | Fox | 324/322 |
|---|---|---|---|
| 5,166,620 | 11/1992 | Panosh | 324/322 |
| 5,198,767 | 3/1993 | Glenat et al. | 324/301 |
| 5,221,897 | 6/1993 | Duret et al. | 324/302 |
| 5,414,357 | 5/1995 | Kernevez et al. | 324/301 |
| 5,455,511 | 10/1995 | Duret | 324/301 |

FOREIGN PATENT DOCUMENTS

| 0296005 | 12/1988 | European Pat. Off. . |
|---|---|---|
| 0345118 | 12/1989 | European Pat. Off. . |
| 0359598 | 3/1990 | European Pat. Off. . |
| 0445017 | 9/1991 | European Pat. Off. . |
| 0451054 | 10/1991 | European Pat. Off. . |
| 92/08996 | 5/1992 | WIPO . |

Primary Examiner—Walter E. Snow
Assistant Examiner—Mark Haynes
Attorney, Agent, or Firm—Pearne, Gordon, McCoy & Granger

[57] ABSTRACT

A nuclear magnetic resonance probe is provided comprising a high frequency resonator (14, 16) having a resonant frequency, a first coaxial conductor (20) connected to the high frequency resonator, and a high frequency supply which supplies the first coaxial conductor (20) the resonant frequency of the high frequency resonator (14, 16). The high frequency supply includes a conductive sampling loop (40) at least partly placed in the high frequency resonator (14, 16) and a broad band, high frequency, amplifier (56) having an input (E) connected to the sampling loop (40) by a second coaxial conductor (50) and an output (S) connected to the first coaxial conductor (20). The assembly forming a high frequency loop oscillator locked to the resonant frequency of the high frequency resonator (14, 16).

10 Claims, 5 Drawing Sheets

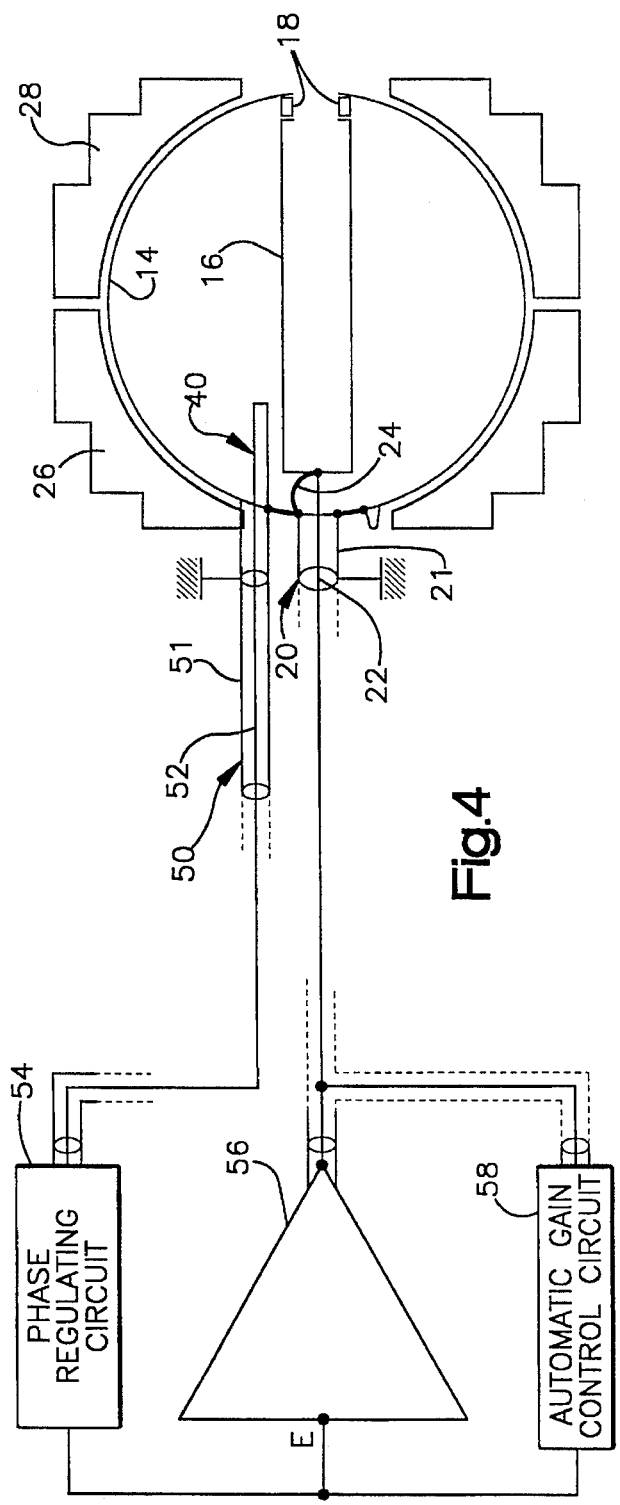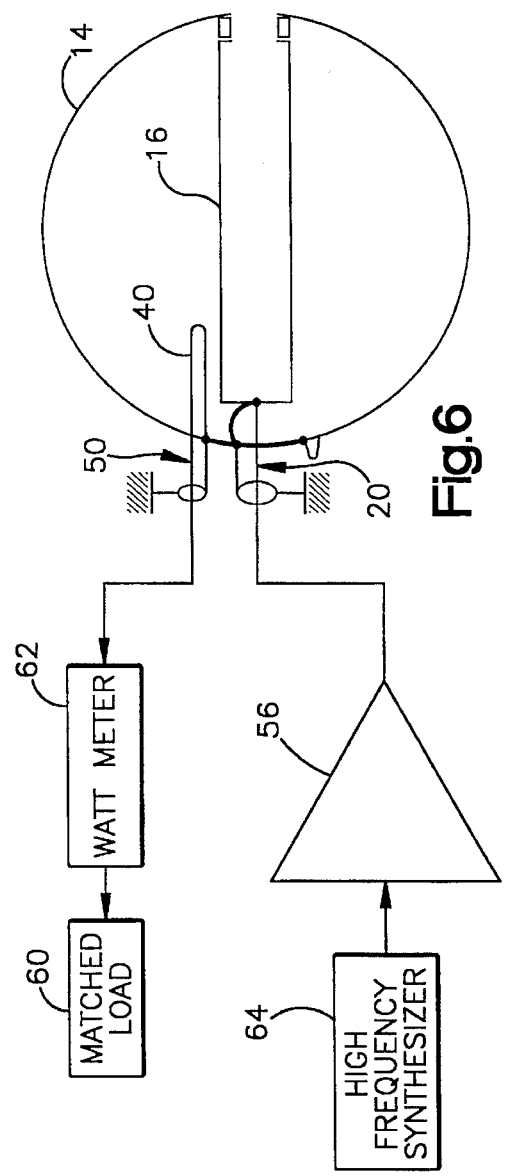

LOOP OSCILLATOR NMR PROBE

BACKGROUND OF THE INVENTION

1. Field of the Invention

The present invention relates to a NMR (Nuclear Magnetic Resonance) magnetometer having a loop oscillator. It is used in the precise measurement of magnetic fields, particularly the geomagnetic field.

2. Description of the Related Art

The probe according to the invention is of known type, e.g. described in French patent applications FR-A-1 447 226 and FR-A-2 098 624. The operating principle of such probes will now be briefly described.

When a liquid sample, whose atomic nuclei have a magnetic moment and a kinetic moment which are not zero, is subject to a magnetic field, the nuclear magnetic moments tend to be aligned in parallel or antiparallel to the field. The energy difference between these two states defines a nuclear resonance energy or a nuclear resonance frequency, which is generally in the low frequency range of approximately 1000 Hz.

However, with the conventional fields, the overall nuclear polarization (positive or negative) of the sample remains low and difficult to detect.

The OVERHAUSER-ABRAGAM effect makes it possible to significantly increase said polarization. To this end an appropriate paramagnetic substance is dissolved in a solvent, said substance being chosen so as to have an unpaired electron giving rise to an excited electron level with a hyperfine structure with four sublevels. Generally, the pumping frequency making it possible to raise the substance to one of said electron sublevels is in the high frequency range, namely a few dozen MHz.

The dipole coupling between the electron spin of the thus excited paramagnetic substance and the nuclear spin of the solvent considerably increases the polarization of the latter. In accordance with the excited electron transition, the positive or negative nuclear polarization of the solvent is favoring.

This method is further improved by a "double effect" implementation. A first radical solution (i.e. a solvent with a paramagnetic substance) is subject to a high frequency, which saturates the electron level favoring the positive polarization of the solvent, whereas a second radical solution is subject to a high frequency, which saturates the electron level favoring the negative polarization of the solvent.

In the first case, an excitation signal at the nuclear resonance frequency applied to the sample will be absorbed by the latter, whereas in the second case, an excitation signal at said same frequency will give rise to a stimulated emission at the resonance frequency. Sampling windings placed around the first and second solutions will then provide voltages of the same frequency, but of opposite phases. A connection to a differential amplifier will make it possible to form the sum thereof. All the parasitic signals induced in these windings and which have the same phase will be cancelled out.

Such a double effect probe can operate with two different solutions and a single excitation frequency, provided that the absorption spectra of the two solutions are reciprocally displaced in such a way that the single frequency corresponds to the positive polarization for one and to the negative polarization for the other.

However, a double effect probe can also operate with the same solution subdivided into two samples and by applying to said two samples two different frequencies, in order to separately saturate the two sublevels of the paramagnetic substance.

Finally, by an ultimate improvement, the signal supplied by the probe, which is at the nuclear resonance frequency, can be reinjected as an excitation signal for the samples; in a loop arrangement which then functions as an oscillator. This leads to a probe of the spin coupling oscillator type.

The attached FIGS. 1 to 3 illustrate this prior art.

FIG. 1 shows a probe comprising a first bottle 1 having a positive polarization with its low frequency winding 2, a second bottle 3 with negative polarization and with its low frequency winding 4, a single high frequency resonator 5 surrounding the two bottles and a high frequency generator 6 supplying said resonator. The two windings 2 and 4 are connected in series - opposition and are connected to the positive and negative inputs of a differential amplifier 7, whose output is relooped, by means of a level regulator 8, to the low frequency windings, looping taking place across a resistive balancing bridge 9.

The frequency of the signal supplied by such an oscillator is equal to the nuclear resonance frequency, which is directly proportional to the ambient magnetic field, the proportionality factor being equal to the gyromagnetic ratio of the atomic nuclei.

FIG. 2 shows two nuclear signals SN obtained by two different solutions A and B as a function of the high frequency F. For a M/1000 deuterated TANO N15 solution in dimethoxane (DME) with 8% water (solution A), there is a first transition at 57.60 MHz and a second transition at 58.90 MHz. For the same radical dissolved in methanol (solution B), 58.90 MHz is obtained for the first transition and 60.50 MHz for the second.

These characteristics are interesting because they make it possible, with a single frequency value (58.90 MHz), to saturate two opposite transitions and obtain the inversion of the macroscopic resultant in one of the solvents with respect to the other.

Numerous embodiments of such probes are described in the two aforementioned documents, as well as in FR-A-2 583 887, FR-A-2 610 760 and FR-A-2 658 955.

For example, FIG. 3 shows a probe comprising an e.g. Pyrex bottle 10 having a spherical shape (but a conical, cylindrical or other shape is also possible). A central Pyrex tube 12 is placed on the axis of the probe. The spherical bottle 10 is externally covered with a conductive coating 14, e.g. a silver paint annealed at 550° C. This coating may not be continuous and instead divided into sectors (e.g. 1 to 8) in order to prevent the formation of eddy currents during the displacement of the probe in the field to be measured. The central tube 12 contains a hollow conductive cylinder 16, e.g. of silver, which is the central core of the resonator and which is connected to the spherical conductive surface 14 by a magnetic capacitors 18. These capacitors are regulatable so as to make it possible to regulate the frequency of the thus formed coaxial resonator.

This resonator is connected to a coaxial cable 20, e.g. of impedance 50 Ohms, formed by an external conductor 21 and a central conductor 22. The external conductor 21 is connected to the external conductor 14 of the resonator and the central conductor 22 is connected to the central core 16. A loop 24 makes it possible to match the resonator to the impedance of the cable (e.g. 50 Ohms) by connecting the external conductor 21 of the cable to the central core 16.

The resonator is completely surrounded by two windings 26, 28 internally having a spherical cap shape and externally having a staircase shape (the relatively inactive zones having been eliminated in order to avoid excessive weight). The windings 26, 28 have an identical shape and are positioned symmetrically with respect to the median plane of the probe and are connected either in series—series, or in series—opposition.

In other embodiments, the resonator can comprise two bottles supplied by a single generator or two separate high frequency generators supplying two resonators tuned to two different resonant frequencies. No matter what variant is used, these prior art probes suffer from disadvantages.

The first disadvantage is linked with a sliding or drifting of the tuning frequency, which leads to a variable standing wave ratio. This leads to a fluctuation of the dissipated power in the resonator leading to a deterioration of the performance characteristics of the probe (appearance of anisotropy, reduction of the signal-to-noise ratio, poor operation of the input differential amplifier). There are two reasons for the resonator tuning frequency drift or slide:

a) The capacitors participating in regulating the tuning of the resonator to the frequency of the high frequency generator do not have a very low temperature coefficient (0 ±20 ppm/° C.). The aforementioned FR-A-2 658 955 proposes the use of a distributed tuning capacitance in order to partly solve this problem, but the recent improvements made to the resonator for reducing the consumption (increase in the quality up to approximately 500) have led to the recurrence of this problem.

b) The geometrical dimensions of the members forming the resonator vary, i.e. the Pyrex bottle, silver deposit, welds, central core, output clips of the capacitors or matching loop, participate in the drift of the resonator tuning frequency.

A second disadvantage relates to manufacturing difficulties. As a result of dimensional variations between individual resonators, it is difficult to reproduce the capacitance to be used for a given tuning frequency. Moreover, the tolerance on the capacitors is not particularly close (±5 at 10%). A precision of 1/1000 is necessary for tuning the frequency of the resonator to the frequency supplied by the high frequency generator (with an accuracy of ±1 KHz on 60 MHz).

A final disadvantage results from the efficiency of the high frequency generator. Improvements made to the resonator have made it possible to very significantly reduce its consumption. The necessary power is now a few dozen milliwatts. Under these conditions, it is very difficult or even impossible to obtain a good efficiency (remaining below 20%), which does not make it possible to take full advantage of the improvement of the resonator.

The object of the present invention is to obviate all these disadvantages.

SUMMARY OF THE INVENTION

For this purpose, the invention proposes replacing the high frequency generator by means forming a loop oscillator, which is automatically locked to the resonant frequency of the resonator.

These means comprise a sampling loop at least partly placed in the resonator and a broad band, high frequency amplifier having an input connected to said loop by a coaxial conductor and an output connected to the coaxial supply conductor of the resonator.

As by design the thus formed oscillator is locked to the resonant frequency of the resonator, it necessarily supplies at the correct frequency the said resonator, no matter what the drifts, fluctuations and variations of various types.

In the above definition, it must be understood that the resonator in question is in no way limited to a particular shape, bottle or solution. It can comprise one or more bottles containing one or more radical solutions.

In an advantageous variant, the amplifier is associated with automatic gain control means.

In another advantageous variant, the probe also comprises phase shifting means inserted between the coaxial sampling conductor and the amplifier input.

BRIEF DESCRIPTION OF THE DRAWINGS

FIG. 4 Shows an embodiment of a probe according to the invention.

FIG. 6 Shows a circuit for calibrating the gain of the amplifier operating in open loop form.

DETAILED DESCRIPTION OF EMBODIMENTS

Figure 1:
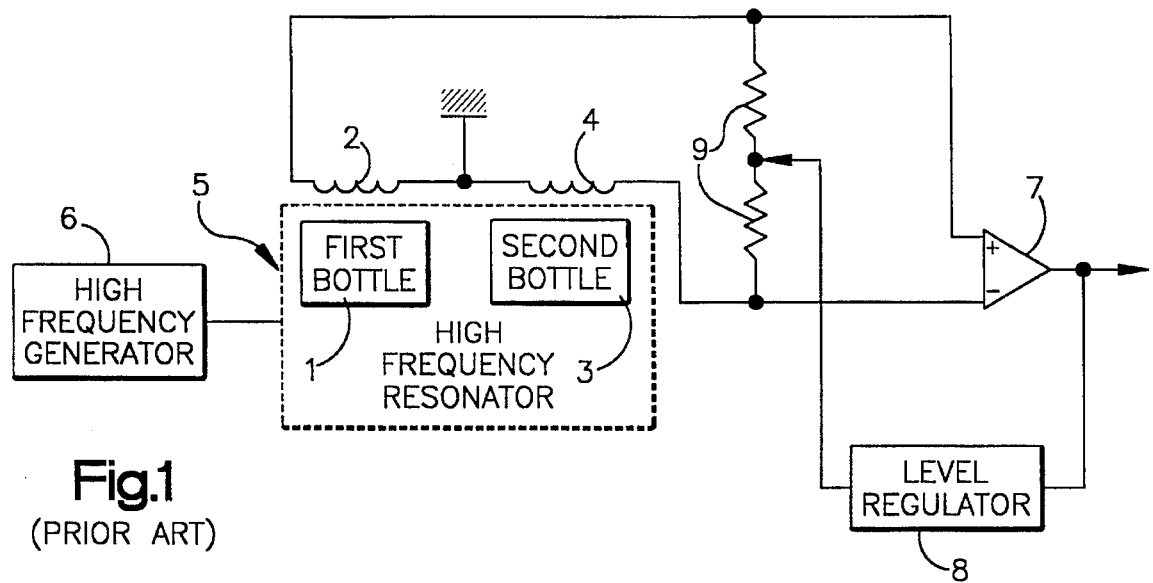
FIG. 1 Already described, diagrammatically shows a prior art NMR probe.
Figure 3:
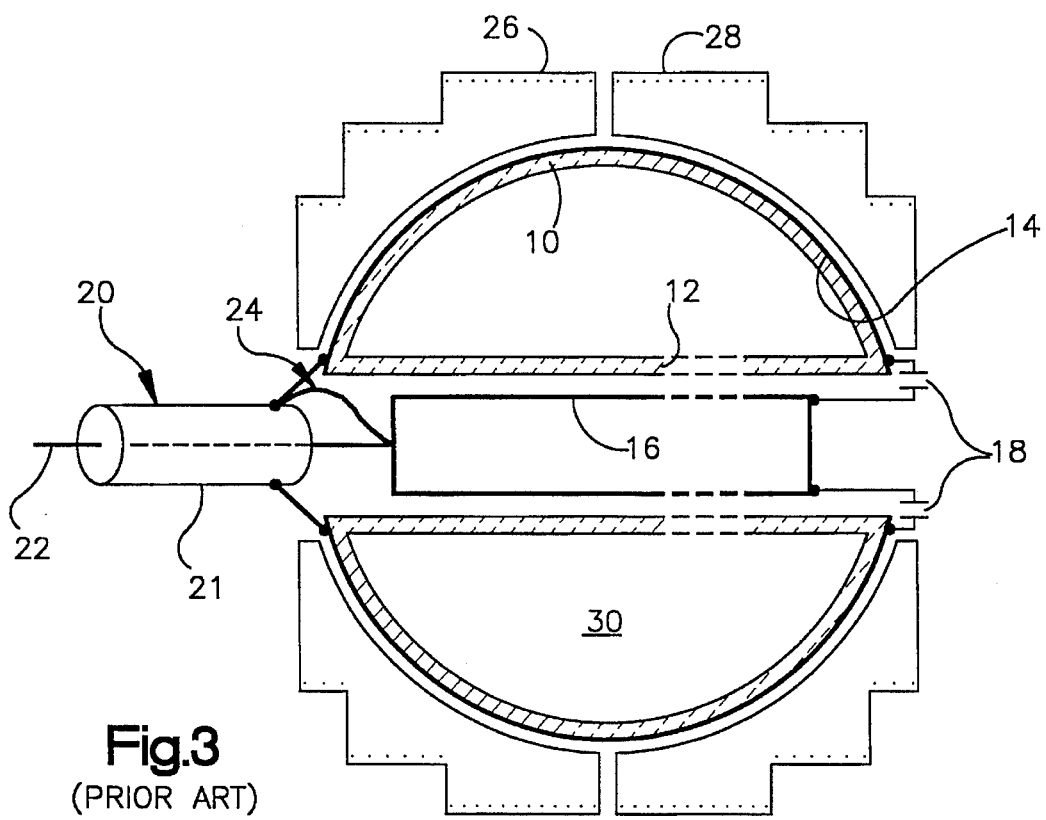
FIG. 3 Already described, shows an embodiment of a Known resonator having a single bottle.
Figure 2:
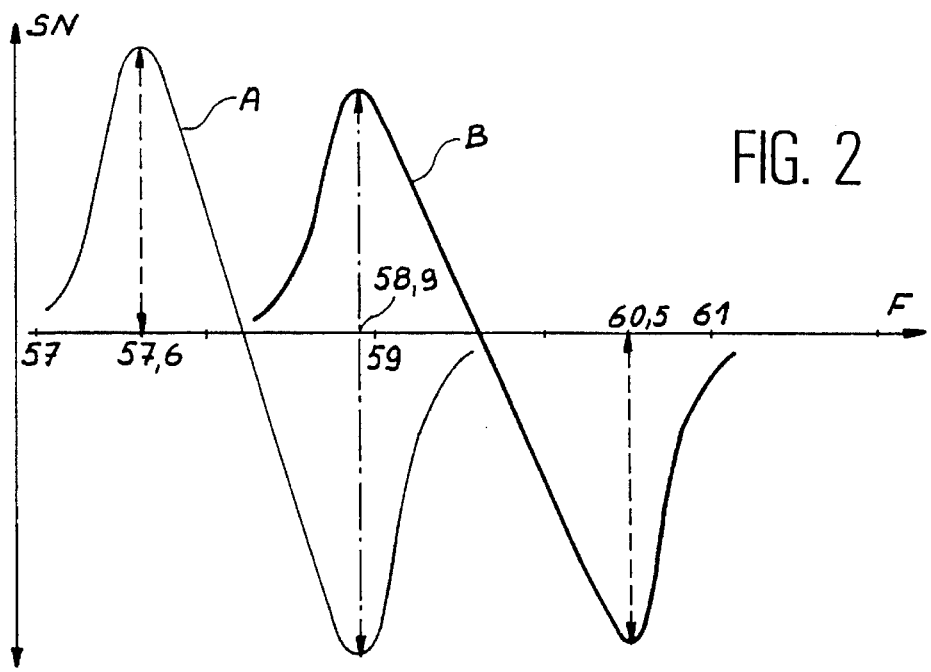
FIG. 2 Already described, shows the variations of a nuclear signal for two different radical solutions.

The probe shown in FIG. 4 comprises a resonator having a single bottle, as in FIG. 3 (identical references in the two drawings indicating the same components). However, according to the invention, the probe of FIG. 4 comprises a sampling loop 40 placed in the resonator and connected to a coaxial conductor 5 incorporating an external conductor 51 which is grounded, as well as a central conductor 52. The coaxial conductor 50 is connected to a phase regulating circuit 54, which is connected to the input E of a broad band, high frequency amplifier 56. The output S of said amplifier is connected to the coaxial supply cable 20 of the resonator. In parallel on the amplifier, there is an automatic gain control circuit 58 used for the power locking of the resonator.

This device operates in the following way. The loop 40 samples by induction part of the electromagnetic field present in the resonator. The sampled signal is amplified by the amplifier 56 and then reinjected into the resonator. In order to compensate possible length differences between the two coaxial conductors 20 and 50 or any other type of phase shift and ensure a reinjection with a correct phase, the phase shifter 54 is provided.

The means constituted by the resonator 14–16, the loop 40, the conductor 50, the phase shifter 54, the amplifier 56, the conductor 20 and again the resonator 14–16, form a loop which can only oscillate on the resonant frequency of the resonator. Therefore the standing wave ratio is always zero by very design and no matter what the temperature, the position of the resonator in space, the position of the expansion bubble, etc.

Figure 5:
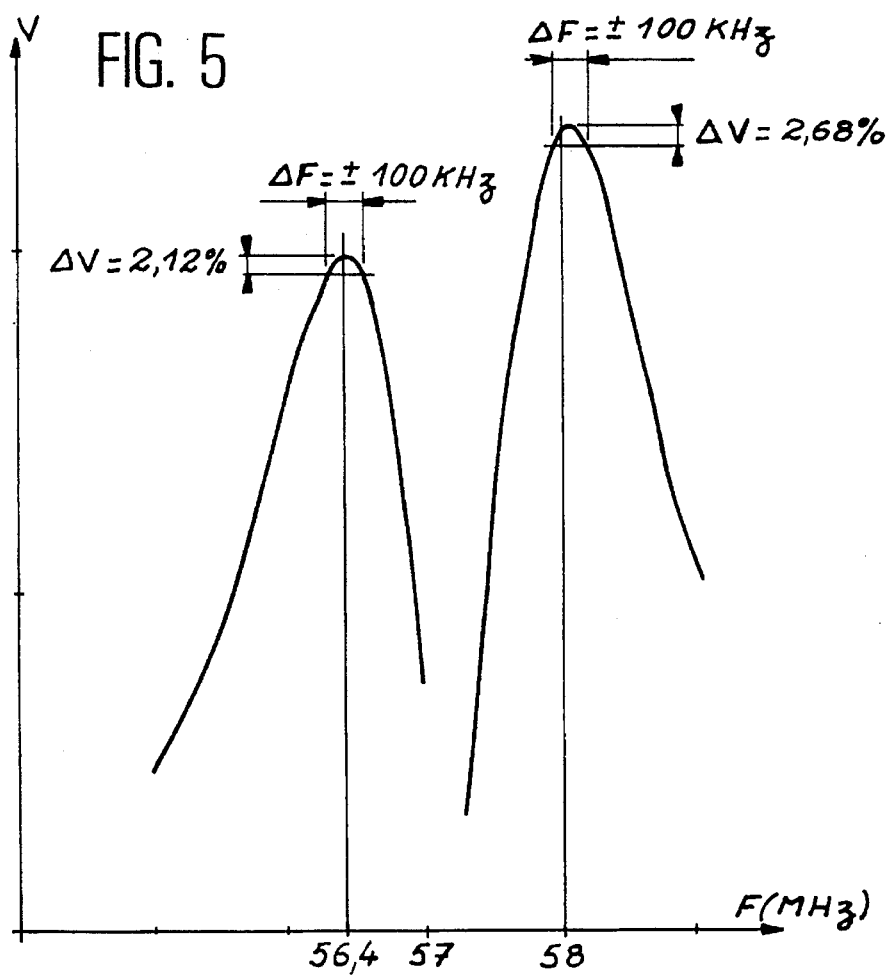
FIG. 5 Shows the shape of the resonance lines for two different frequencies.

FIG. 5 shows the high frequency spectrum of a M/1000 deuterated TANO N15 radical solution in tetrahydrofuran (THF) as the solvent. The HF spectrum again shows two lines at 56.4 MHz and 58 MHz, which are sufficiently wide to allow a relatively large frequency displacement of ±100 KHz only leading to a limited amplitude drop on the part of the nuclear signal (approximately 3%). It has also been found that a high frequency exciting frequency displacement of the transitions (±100 KHz) does not influence the precession or LARMOR frequency and also does not lead to a noise increase.

For explanatory reasons only, the applicant has produced a spherical resonator having a diameter of 74 mm using coaxial conductors of impedance 50 Ohms. The tuning capacitors had a fixed value. The sampling loop had a length of 20 mm and a width of 3 min.

FIG. 6 shows an open loop arrangement making it possible to measure the power sampled by the loop located in the resonator. The second coaxial conductor 50 is connected to a wattmeter 62 terminated by a matched load 60. The amplifier 56 is supplied by a high frequency synthesizer 64.

The measured sample power is 25 MW for an injected power of 100 mW dissipated in the resonator. This power is more than adequate for maintaining high frequency oscillation.

Figure 7:
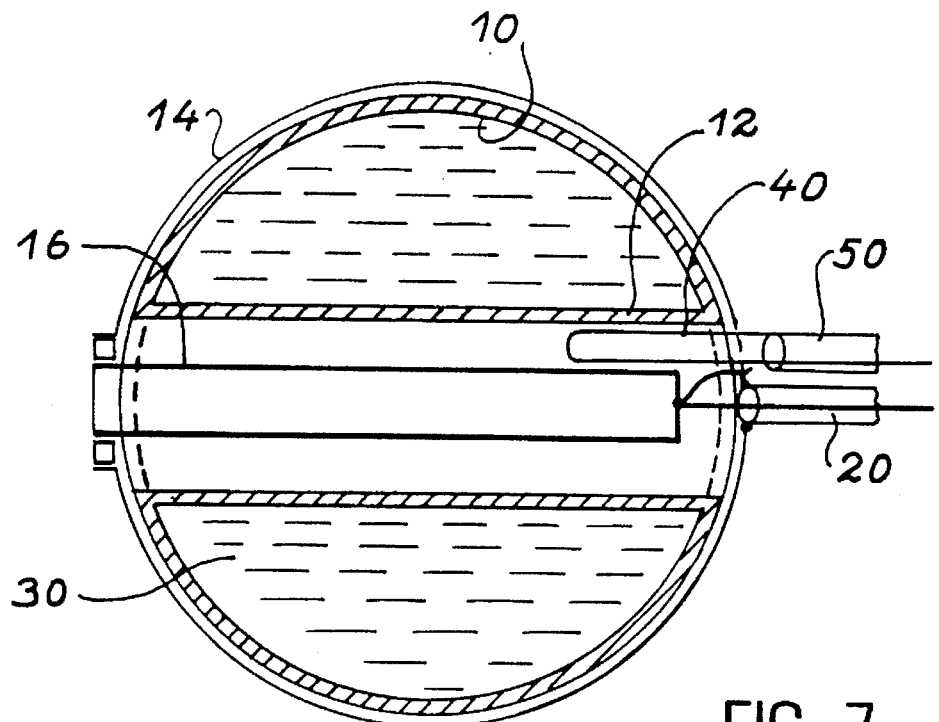
FIG. 7 Shows a first possible position for the sampling loop.
Figure 8:
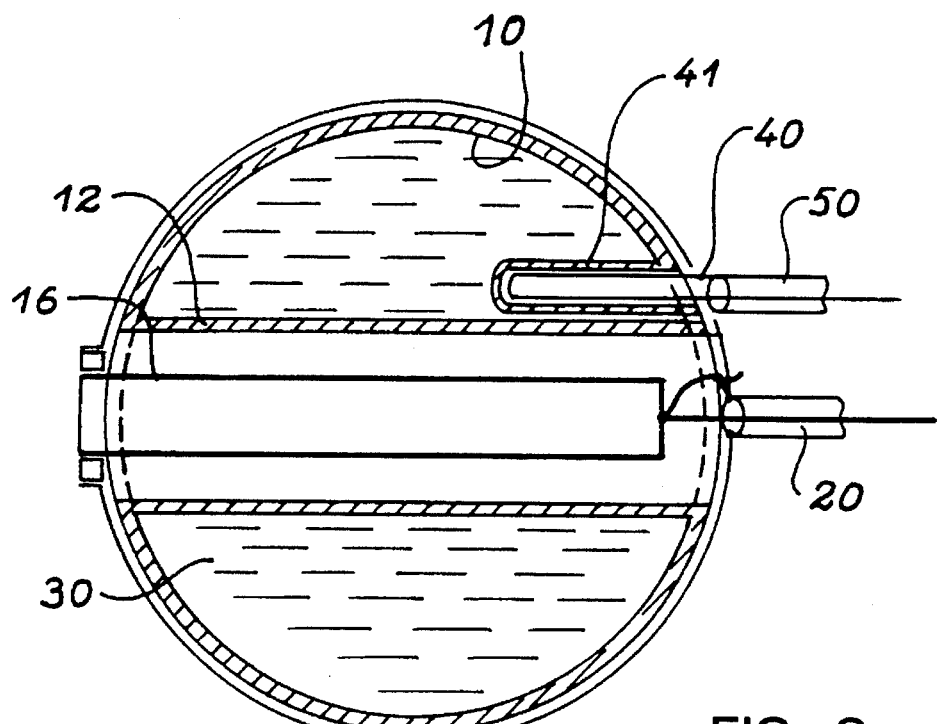
FIG. 8 Shows a second possible position for the same sampling loop.

FIGS. 7 and 8 show how it is possible to place the sampling loop 40 in the resonator. In FIG. 7 the loop is inserted between the conductive core 16 and the internal tube 12 of the bottle. In FIG. 8 the e.g. Pyrex tube 41 is introduced into the radical solution and the sampling loop 40 is placed within the tube 41.

Figure 9:
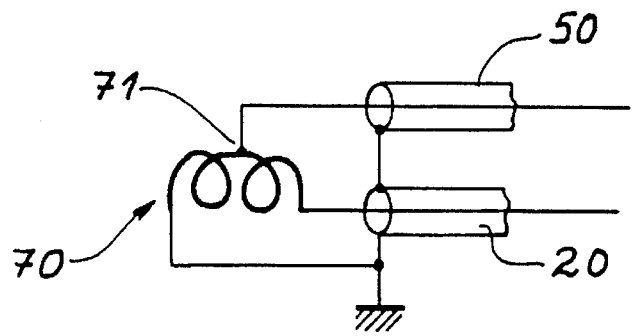
FIG. 9 Illustrates a compact embodiment of a double function loop (matching, sampling).

FIG. 9 shows an embodiment where a single winding 70 serves both as the transformation or matching loop and as the sampling loop. This winding 70 comprises two turns with a centre 71. The two turns are connected in parallel on the first coaxial conductor 20 and the centre 71 to the core of the second coaxial conductor 50.

Figure 10:
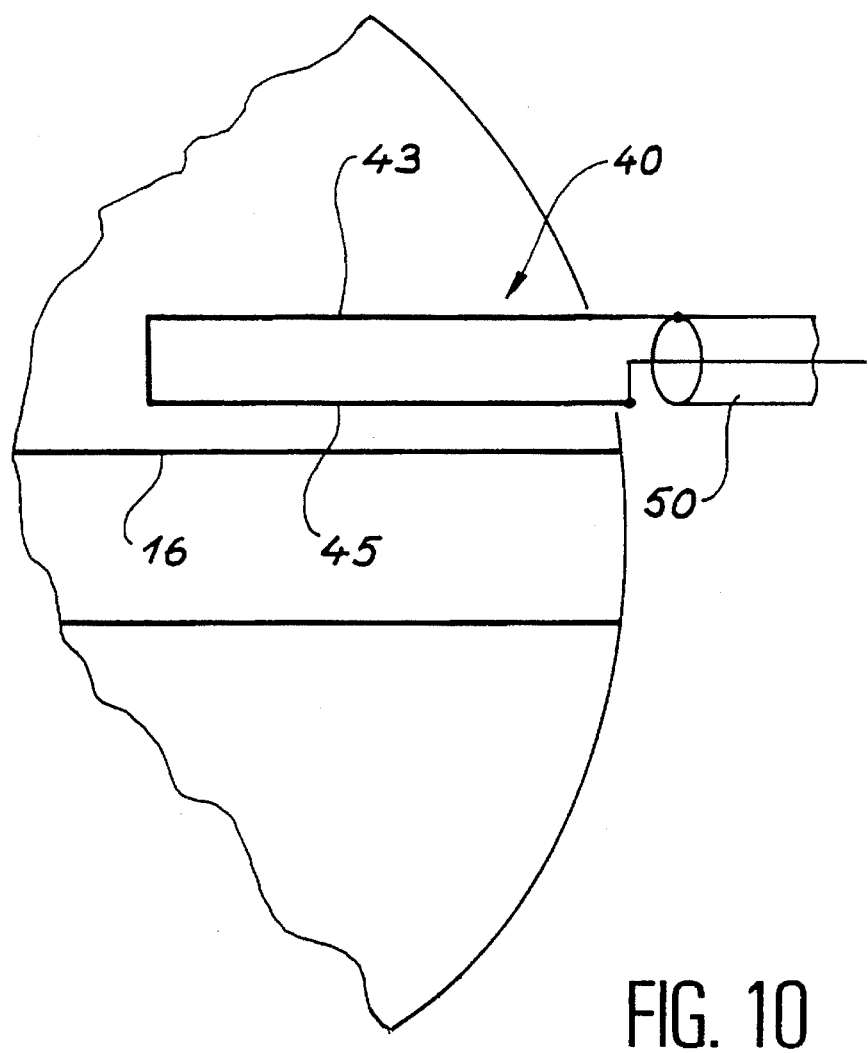
FIG. 10 Shows a loop able to pivot about its axis.

Finally, FIG. 10 shows a loop 40 formed by two parallel strands 43, 45, the loop being able to pivot about its own longitudinal axis. This pivoting makes it possible to regulate the coupling to the cavity.

Another coupling regulation method can be obtained by moving the loop parallel to itself in order to introduce it to a greater or lesser extent into the resonator.

I claim:

1. Nuclear magnetic resonance probe comprising at least one high frequency resonator (14, 16) having a resonant frequency, said high frequency resonator containing at least one bottle (10, 12) having at least one radical solution (30), a first coaxial conductor (20) connected to the high frequency resonator, and high frequency supply means for supplying said first coaxial conductor (20) the resonant frequency of the high frequency resonator (14, 16), said high frequency supply means including a conductive sampling loop (40) at least partly placed in the high frequency resonator (14, 16) and a broad band, high frequency amplifier (56) having an input (E) connected to said sampling loop (40) by a second coaxial conductor (50) and an output (S) connected to said first coaxial conductor (20), the amplifier (56), the first coaxial conductor (20), the high frequency resonator (14, 16), the sampling loop (40), and the second coaxial conductor (50) constituting a high frequency loop oscillator locked to the resonant frequency of the high frequency resonator (14, 16).

2. Probe according to claim 1, wherein said supply means includes means (58) for automatically controlling gain of the amplifier (56).

3. Probe according to claim 1, wherein said supply means includes phase shifting means (54) between the second coaxial conductor (50) and the input (E) of the amplifier (56).

4. Probe according to any one of the claims 1 to 3, wherein said probe comprises only one bottle, said bottle comprising an internal cylindrical tube (12) and an external wall (10), the high frequency resonator being formed by a conductive core (16) occupying the internal cylindrical tube (12) of the bottle and a conductive coating (14) deposited on the external wall 10) of the bottle, the conductive core (16) and the conductive coating (14) being connected, on one side of the probe, to at least one fuming capacitor (18) and, on the other side, to the first coaxial conductor (20) by an impedance matching loop (24).

5. Probe according to claim 4, characterized in that the sampling loop (40) is placed between the conductive core (16) and the internal tube (12) of the bottle.

6. Probe according to claim 4, wherein said sampling loop (40) is placed in a tube (41) penetrating the radical solution between the cylindrical internal tube (12) and the external wall (10).

7. Probe according to claim 1, wherein said sampling loop (40) is formed by two elongated, parallel conductive strands (43, 45) at least partly engaged in the high frequency resonator and connected to the second coaxial conductor (50).

8. Probe according to claim 7, wherein said sampling loop (40) can pivot about an axis parallel to the two strands (43).

9. Probe according to claim 4, wherein said sampling loop and the matching loop are constituted by the same winding (70) formed by two turns having a center (71).

10. Probe according to claim 7, wherein said sampling loop can have a translation movement on an axis parallel to the two strands (43, 45).

* * * * *